United States Patent
Gershon et al.

(10) Patent No.: US 9,570,915 B1
(45) Date of Patent: Feb. 14, 2017

(54) DIRECT INTEGRATION OF PHOTOVOLTAIC DEVICE INTO CIRCUIT BOARD

(71) Applicant: International Business Machines Corporation, Armonk, NY (US)

(72) Inventors: Talia S. Gershon, White Plains, NY (US); Richard A. Haight, Mahopac, NY (US); James B. Hannon, Lake Lincolndale, NY (US); Teodor K. Todorov, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/977,700

(22) Filed: Dec. 22, 2015

(51) Int. Cl.
| | | |
|---|---|---|
| H02J 1/10 | (2006.01) | |
| H02J 3/38 | (2006.01) | |
| H02J 7/34 | (2006.01) | |
| H02S 40/38 | (2014.01) | |
| H05K 1/18 | (2006.01) | |
| H01L 31/0224 | (2006.01) | |
| H01L 31/048 | (2014.01) | |
| H01L 31/05 | (2014.01) | |
| H01L 31/18 | (2006.01) | |
| H01L 31/02 | (2006.01) | |
| H05K 3/32 | (2006.01) | |
| H05K 1/16 | (2006.01) | |
| H05K 3/00 | (2006.01) | |
| H05K 3/28 | (2006.01) | |
| H01L 31/0203 | (2014.01) | |
| H02J 7/35 | (2006.01) | |

(52) U.S. Cl.
CPC ........... *H02J 3/383* (2013.01); *H01L 31/0203* (2013.01); *H01L 31/02008* (2013.01); *H01L 31/022425* (2013.01); *H01L 31/048* (2013.01); *H01L 31/0504* (2013.01); *H01L 31/18* (2013.01); *H02J 7/35* (2013.01); *H02S 40/38* (2014.12); *H05K 1/162* (2013.01); *H05K 1/18* (2013.01); *H05K 3/0011* (2013.01); *H05K 3/28* (2013.01); *H05K 3/32* (2013.01); *H02J 7/345* (2013.01); *H05K 2201/10015* (2013.01); *H05K 2201/10037* (2013.01); *H05K 2201/10143* (2013.01); *H05K 2203/1305* (2013.01)

(58) Field of Classification Search
CPC ...... H02J 3/383; H02S 40/38; H01L 31/02008
USPC .......................................................... 307/18
See application file for complete search history.

(56) References Cited

U.S. PATENT DOCUMENTS

| | | |
|---|---|---|
| 5,777,903 A | 7/1998 | Piosenka |
| 7,098,394 B2 | 8/2006 | Armer |
| 2014/0048900 A1* | 2/2014 | Keysar .................... H01L 31/05 257/443 |

(Continued)

*Primary Examiner* — Carlos Amaya
(74) *Attorney, Agent, or Firm* — Cantor Colburn LLP; Vazken Alexanian (57) ABSTRACT

Aspects relate to an integrated system that is electrically powered. The integrated system includes a circuit board and a photovoltaic device. The circuit board includes one or more on-board electronic components and an upper surface configured as a substrate. The photovoltaic device is integrally deposited on the upper surface of the circuit board and electrically connected to the one or more on-board electronic components, wherein the upper surface of the circuit board is a photovoltaic device substrate.

7 Claims, 9 Drawing Sheets

(56) References Cited

U.S. PATENT DOCUMENTS

2016/0094072 A1* 3/2016 Chen .................... H02J 7/0055
 320/101

* cited by examiner

DIRECT INTEGRATION OF PHOTOVOLTAIC DEVICE INTO CIRCUIT BOARD

BACKGROUND

The present disclosure relates generally to a photovoltaic device, and more specifically, to a method and system for including a photovoltaic device on a circuit board.

There is a growing need for wide-scale deployment of sensors or circuits which contain a portable power source so that they can be deployed "off the grid" in a standalone fashion without requiring a direct connection to a power source via a wired connection. Such portable applications are currently implemented using an in-device portable power supply. In some cases this power supply is a battery or supercapacitor while in other cases the device may include a solar cell that provides power.

Some companies already offer products (sensors and circuits) that are powered by a completed solar cell that is "plugged in" to the sensor or circuit. However, providing an accompanying solar cell that connects to a device that is to be powered is costly due to added complexity, material needs, and space requirements. For example, a significant fraction of the cost of a thin film solar cell is the glass substrate. The costs of providing this glass substrate can account for as much as 50% of the overall cost of the solar cell alone. Further, additional housing and mounting hardware that is used to encompass the additional power source device within the portable device drives up the overall costs.

SUMMARY

In accordance with an embodiment, an integrated system includes a circuit board including one or more on-board electronic components and an upper surface configured as a substrate, and a photovoltaic device integrally deposited on the upper surface of the circuit board and electrically connected to the one or more on-board electronic components, wherein the upper surface of the circuit board is a photovoltaic device substrate.

In accordance with another embodiment, a method of manufacturing an integrated device is provided. The method includes providing a circuit board, configuring an upper surface of the circuit board as a substrate, integrally depositing photovoltaic device layers on the upper surface of the circuit board to form a photovoltaic device using the upper surface of the circuit board as a photovoltaic device substrate, and electrically connecting the photovoltaic device to one or more on-board electronic components.

In accordance with another embodiment, a method of operating an integrated device is provided. The method includes providing a circuit board that includes one or more on-board electronic components and an upper surface configured as a substrate, providing photovoltaic device layers on the upper surface of the circuit board that form a photovoltaic device using the upper surface of the circuit board as a photovoltaic device substrate, generating electricity using the photovoltaic device, and powering one or more of the on-board electronic components using the electricity from the photovoltaic device.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

One or more embodiments described herein are directed to a method, apparatus, and system that eliminate the need for a separate individual substrate for each photovoltaic element and instead directly and monolithically integrate the photovoltaic device directly into or onto the circuit board or sensor/chip using the circuit board or sensor/chip as the substrate. Accordingly, the photovoltaic device is integrated directly onto a circuit board and powers a portable sensor or microchip or subcomponent thereof. This could provide significant cost savings given that the substrate is effectively free because the circuit board is used as the substrate. Further, a thin film battery could also optionally be added to allow the device to operate in the absence of sunlight.

Figure 1:
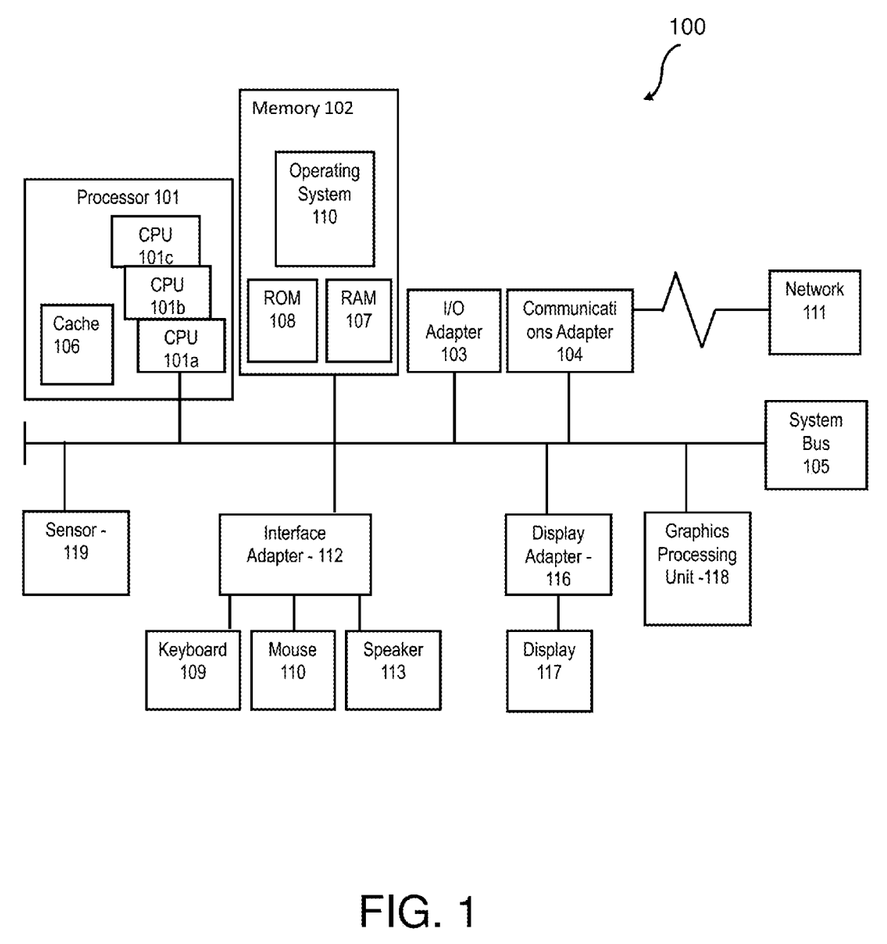
FIG. 1 depicts a block diagram of an electronic computing device in accordance with some embodiments of this disclosure.

Turning now to FIG. 1, an electronic computing device 100, which may also be called a computer system 100, that includes a plurality of electronic computing device sub-components is generally shown in accordance with one or more embodiments. Particularly, FIG. 1 illustrates a block diagram of a computer system 100 (hereafter "computer 100") for use in practicing the embodiments described herein. The methods described herein can be implemented in hardware, software (e.g., firmware), or a combination thereof. In an exemplary embodiment, the methods described herein are implemented in hardware, and may be part of the microprocessor of a special or general-purpose digital computer, such as a personal computer, workstation, minicomputer, or mainframe computer. Computer 100 therefore can embody a general-purpose computer. In another exemplary embodiment, the methods described herein are implemented as part of a mobile device, such as, for example, a mobile phone, a personal data assistant (PDA), a tablet computer, etc.

In an exemplary embodiment, in terms of hardware architecture, as shown in FIG. 1, the computer 100 includes processor 101. Computer 100 also includes memory 102 coupled to processor 101, and one or more input and/or output (I/O) adaptors 103, that may be communicatively coupled via a local system bus 105. Communications adaptor 104 may operatively connect computer 100 to one or more networks 111. System bus 105 may also connect one or more user interfaces via interface adaptor 112. Interface adaptor 112 may connect a plurality of user interfaces to computer 100 including, for example, keyboard 109, mouse 110, speaker 113, etc. System bus 105 may also connect display adaptor 116 and display 117 to processor 101. Processor 101 may also be operatively connected to graphical processing unit 118.

Further, the computer 100 may also include a sensor 119 that is operatively connected to one or more of the other electronic sub-components of the computer 100 through the system bus 105. The sensor 119 can be an integrated or a standalone sensor that is separate from the computer 100 and may be communicatively connected using a wire or may communicate with the computer 100 using wireless transmissions.

Processor 101 is a hardware device for executing hardware instructions or software, particularly that stored in a non-transitory computer-readable memory (e.g., memory 102). Processor 101 can be any custom made or commercially available processor, a central processing unit (CPU), a plurality of CPUs, for example, CPU 101a-101c, an auxiliary processor among several other processors associated with the computer 100, a semiconductor based microprocessor (in the form of a microchip or chip set), a macroprocessor, or generally any device for executing instructions. Processor 101 can include a memory cache 106, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 106 may be organized as a hierarchy of more cache levels (L1, L2, etc.).

Memory 102 can include random access memory (RAM) 107 and read only memory (ROM) 108. RAM 107 can be any one or combination of volatile memory elements (e.g., DRAM, SRAM, SDRAM, etc.). ROM 108 can include any one or more nonvolatile memory elements (e.g., erasable programmable read only memory (EPROM), flash memory, electronically erasable programmable read only memory (EEPROM), programmable read only memory (PROM), tape, compact disc read only memory (CD-ROM), disk, cartridge, cassette or the like, etc.). Moreover, memory 102 may incorporate electronic, magnetic, optical, and/or other types of non-transitory computer-readable storage media. Note that memory 102 can have a distributed architecture, where various components are situated remote from one another, but can be accessed by the processor 101.

The instructions in memory 102 may include one or more separate programs, each of which comprises an ordered listing of computer-executable instructions for implementing logical functions. In the example of FIG. 1, the instructions in memory 102 may include a suitable operating system 113. Operating system 113 can control the execution of other computer programs and provides scheduling, input-output control, file and data management, memory management, and communication control and related services.

Input/output adaptor 103 can be, but not limited to, one or more buses or other wired or wireless connections, as is known in the art. The input/output adaptor 103 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

Interface adaptor 112 may be configured to operatively connect one or more I/O devices to computer 100. For example, interface adaptor 112 may connect a conventional keyboard 109 and mouse 110. Other output devices, speaker 113, for example, may be operatively connected to interface adaptor 112. Other output devices may also be included, although not shown. For example, devices may include but are not limited to a printer, a scanner, microphone, and/or the like. Finally, the I/O devices connectable to interface adaptor 112 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like.

Computer 100 can further include display adaptor 116 coupled to one or more displays 117. In an exemplary embodiment, computer 100 can further include communications adaptor 104 for coupling to a network 111.

Network 111 can be an IP-based network for communication between computer 100 and any external device. Network 111 transmits and receives data between computer 100 and external systems. In an exemplary embodiment, network 111 can be a managed IP network administered by a service provider. Network 111 may be implemented in a wireless fashion, e.g., using wireless protocols and technologies, such as WiFi, WiMax, etc. Network 111 can also be a packet-switched network such as a local area network, wide area network, metropolitan area network, Internet network, or other similar type of network environment. The network 111 may be a fixed wireless network, a wireless local area network (LAN), a wireless wide area network (WAN) a personal area network (PAN), a virtual private network (VPN), intranet or other suitable network system.

If computer 100 is a PC, workstation, laptop, tablet computer and/or the like, the instructions in the memory 102 may further include a basic input output system (BIOS)

(omitted for simplicity). The BIOS is a set of essential routines that initialize and test hardware at startup, start operating system 113, and support the transfer of data among the operatively connected hardware devices. The BIOS is stored in ROM 108 so that the BIOS can be executed when computer 100 is activated. When computer 100 is in operation, processor 101 may be configured to execute instructions stored within the memory 102, to communicate data to and from the memory 102, and to generally control operations of the computer 100 pursuant to the instructions.

According to one or more embodiments, any one of the electronic computing device sub-components of the computer 100 includes a circuit board that requires a power source. Accordingly, a photovoltaic device may be integrated on the circuit boards of any of the electronic computing device sub-components to locally provide power to devices on the circuit boards. For example, the sensor 119 can include a circuit board on which a photovoltaic device can be integrally formed thereby providing a localized power source directly on the circuit board for powering elements of the circuit board. This localized power supply allows the sensor 119 to operate as a standalone electronic computer device sub-component.

Figure 2:
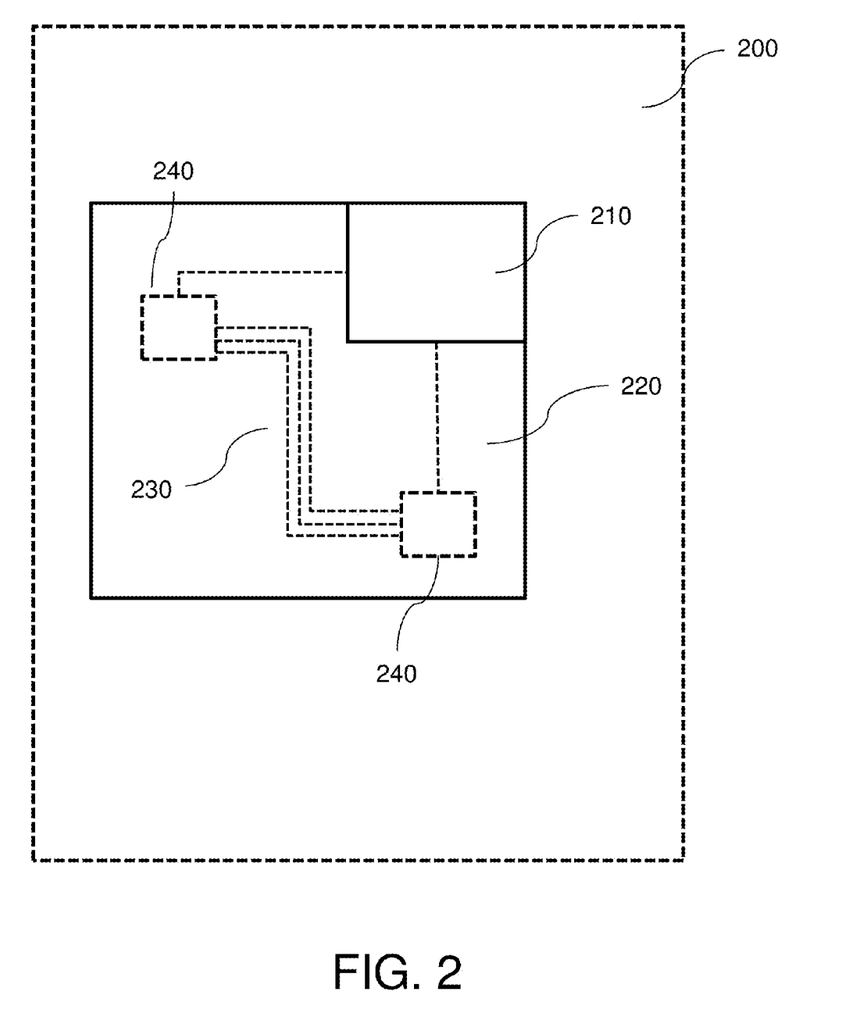
FIG. 2 depicts an electronic computing device sub-component in accordance with some embodiments of this disclosure.

For example, turning now to FIG. 2, an electronic computing device sub-component 200 is shown in accordance with some embodiments of this disclosure. The electronic computing device sub-component 200 can be any one of the electronic computing device sub-components of the computer 100 as shown in FIG. 1. As shown, the electronic computing device sub-component 200 includes at least one circuit board 220 and a photovoltaic device 210 that is integrally deposited on the circuit board 220. The circuit board 220 also includes wires and/or traces 230 that connect individual on-board electronic components 240 on the circuit board 220 to each other and to the photovoltaic device 210. Thus, the photovoltaic device 210 can provide generated power to the on-board electronic components 240 on the circuit board 220.

Figure 3A:
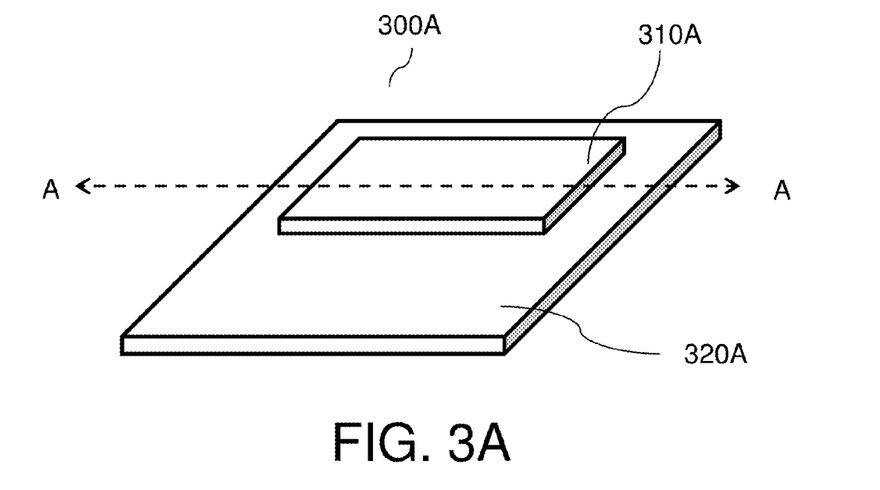
FIG. 3A depicts an integrated system including a circuit board and photovoltaic device in accordance with some embodiments of this disclosure.

Turning now to FIG. 3A, an integrated system 300A including a circuit board 320A and photovoltaic device 310A is shown in accordance with some embodiments of this disclosure. In this embodiment, the circuit board 320A includes an upper surface upon which the photovoltaic device 310A is deposited. The upper surface of the circuit board 320A is planarized to provide a flat even surface upon which the layers of the photovoltaic device 310A can be accurately deposited. For example, in accordance with one embodiment, planarization of the upper surface of the circuit board 320A includes making the surface entirely flat (i.e. filling in the holes of the board and/or removing protrusions from the surface) prior to depositing the photovoltaic device 310A (which ultimately would stick up from the surface by a couple of hundred nm or a few microns).

According to another embodiment, the upper surface of the circuit board 320A may also include a barrier layer. The barrier layer, e.g. spin-on-glass, is placed onto the circuit board 320A prior to forming the photovoltaic device 310A layers like the electrodes, absorbers, etc. This barrier layer can provide a covering for when the laminate surface of the circuit board 320A requires being covered over with something inert.

As shown, the photovoltaic device 310A can be provided such that it covers a large portion of the circuit board 320A without extending to the edges of the circuit board 320A. According to other embodiments, parameters such as the shape, size, location, and number of photovoltaic devices can be adjusted based on the desired power required by electronic devices on the circuit board. The parameters can also be adjusted based on the shape, size, design, and arrangement of electronic devices on the circuit board. The parameters can also be adjusted based on the properties of the circuit board itself.

Figure 3B:
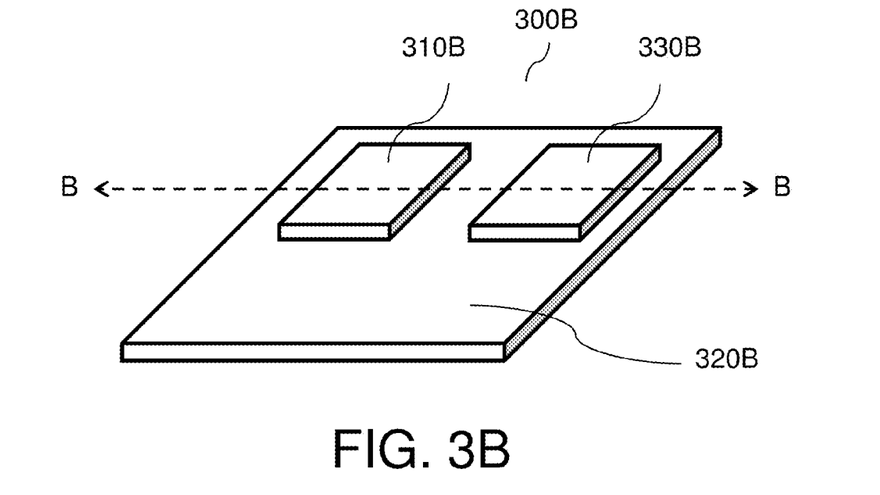
FIG. 3B depicts a an integrated system including a circuit board and multiple photovoltaic devices in accordance with some embodiments of this disclosure.

For example, turning now to FIG. 3B, an integrated system 300B, including a circuit board 320B and multiple photovoltaic devices 310B, 330B, is shown in accordance with some embodiments of this disclosure. A first photovoltaic device 310B is provided that can be configured to power an individual or subset of electronic components on the circuit board 320B. Similarly, the second photovoltaic device 330B is provided on the circuit board 320B to power a subset of desired electronic components. Alternatively, the photovoltaic devices 310B, 330B may be connected in series or in parallel to provide a combined power to electronic components on the circuit board 320B in accordance with parameters of the electronic components and circuit board 320B. As shown, the photovoltaic devices 310B and 330B are of similar size and shape and are arranged symmetrically on the circuit board 320B. In another embodiment, multiple photovoltaic devices provided on a circuit board can be of different sizes and shape and deposited anywhere on the upper surface of the circuit board.

Figure 4A:
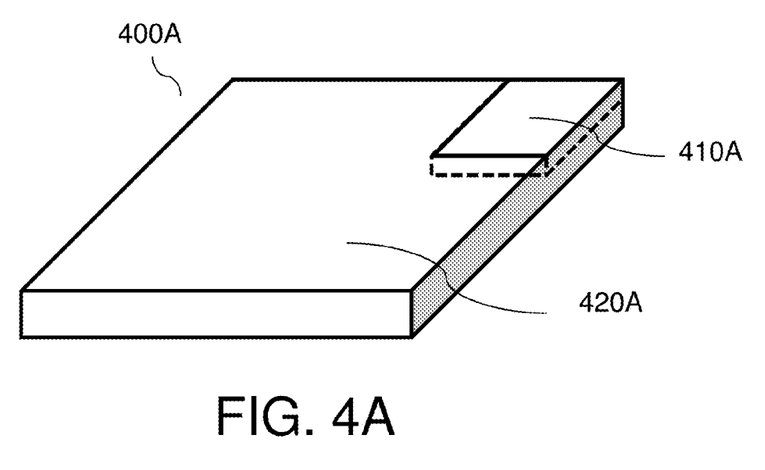
FIG. 4A depicts an integrated system including a circuit board and photovoltaic device in accordance with some embodiments of this disclosure.

Turning now to FIG. 4A, an integrated system 400A, including a circuit board 420A and photovoltaic device 410A, is shown in accordance with some embodiments of this disclosure. In this embodiment, the circuit board 420A includes an upper surface upon which the photovoltaic device 410A is deposited. The upper surface of the circuit board 420A is planarized, at least in part, to provide a flat even surface within a depressed portion. The layers of the photovoltaic device 410A are then accurately deposited within the depressed portion of the upper surface that is planarized. This depressed portion, which can also be called a cavity or indented region, can be provided with a depth that is equal to the overall height of the photovoltaic device 410A that is deposited in the cavity. Accordingly, the resulting overall integrated system 400A would be totally flat. As shown, the photovoltaic device 410A can be provided such that it covers a large portion of the circuit board 420A extending to multiple edges of the circuit board 420A. According to other embodiments, parameters such as the shape, size, location, and number of photovoltaic devices can be adjusted based on the desired power required by electronic devices on the circuit board. The parameters can also be adjusted based on the shape, size, design, and arrangement of electronic devices on the circuit board. The parameters can also be adjusted based on the properties of the circuit board itself such as the size, depth, and placement of the cavity within which the photovoltaic device 410A is deposited.

Figure 4B:
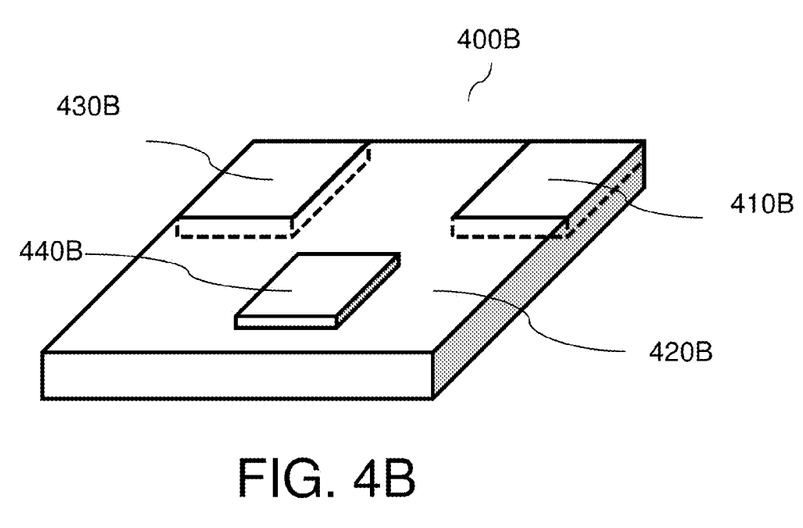
FIG. 4B depicts an integrated system including a circuit board and multiple photovoltaic devices in accordance with some embodiments of this disclosure.

For example, as shown in FIG. 4B, an integrated system 400B including a circuit board 420B and multiple photovoltaic devices 410B, 430B, and 440B, is shown in accordance with some embodiments of this disclosure. A first photovoltaic device 410B is provided that can be configured to power an individual or subset of electronic components on the circuit board 420B. Similarly, a second photovoltaic device 430B and a third photovoltaic device 440B are provided on the circuit board 420B to power a subset of desired electronic components. Alternatively, the photovoltaic devices 410B, 430B, 440B can be connected in series or in parallel to provide a combined power to electronic components on the circuit board 420B in accordance with parameters of the electronic components and circuit board 420B. As shown, the photovoltaic devices 410B and 430B are of similar size and shape and are arranged symmetrically within depressed regions on the circuit board 420B. In contrast, the photovoltaic device 440B is deposited on a flat portion of the upper surface. In another embodiment, multiple photovoltaic devices provided on a circuit board can be of different sizes and shape and deposited anywhere on the upper surface of the circuit board.

Figure 5A:
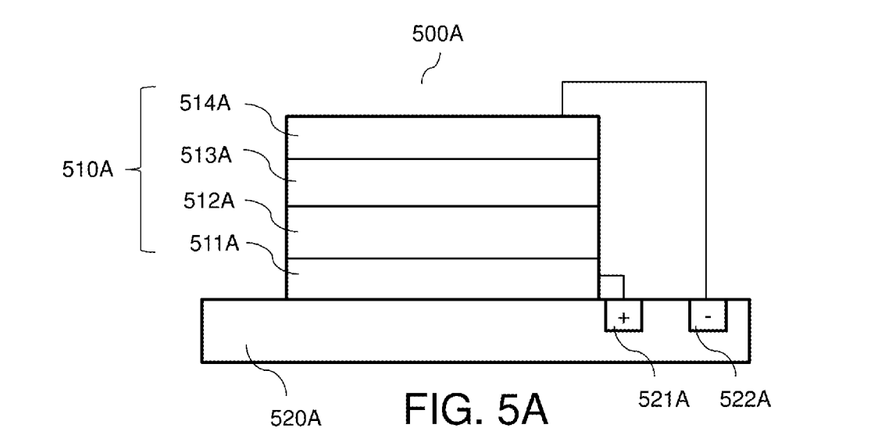
FIG. 5A is a cross-sectional view along A-A, as shown in FIG. 3A, depicting the layers of a photovoltaic device and connectors in accordance with some embodiments of this disclosure.

In accordance with one or more embodiments of this disclosure, FIG. 5A shows a cross-sectional view along an axis A-A as shown in FIG. 3A, that depicts layers of a photovoltaic device 510A and connectors 521A, 522A of an integrated system 500A. The photovoltaic device 510A includes a bottom electrode 511A that is integrally deposited on the upper surface of the circuit board 520A. By depositing the first layer of the photovoltaic device 510A, specifically the bottom electrode 511A, directly onto the circuit board 520A, the upper surface of the circuit board serves as the substrate for the photovoltaic device 510A, thereby not requiring a separate substrate. The photovoltaic device 510A also includes a semi-conductor absorber layer 512A, a buffer layer 513A, and a top electrode 514A. The semi-conductor absorber layer 512A can specifically be a photovoltaic absorber that is deposited on the bottom electrode 511A. According to one or more additional embodiments, the semi-conductor absorber layer 512A can be either a combination of semi-conductor layers or a single semi-conductor layer with p- and n-type materials mixed in. The buffer layer 513A is deposited on the semi-conductor absorber layer 512A and the top electrode 514A is deposited on the buffer layer 513A. The bottom electrode 511A is connected to a positive connector junction 521A of the circuit board 520A, which provides a connection to one or more on-board electronic components. Similarly, the top electrode 514A is connected to a negative connector junction 522A of the circuit board 520A, which provides a connection to the one or more on-board electronic components. Accordingly, through these connections the photovoltaic device 510A can provide power to on-board electronic components on the circuit board 520A.

According to another exemplary embodiment the photovoltaic device 510A includes the four layers as shown wherein the layers are a bottom electrode 511A, a p-type semiconductor 512A, an n-type semiconductor 513A, and a top electrode 514A, where the top electrode 514A is transparent.

Figure 5B:
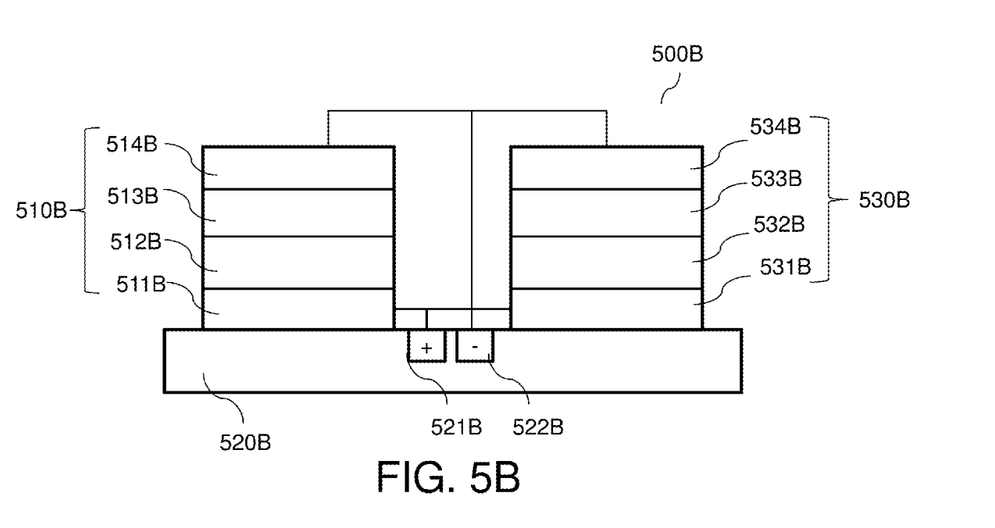
FIG. 5B is a cross-sectional view along B-B, as shown in FIG. 3B, depicting the layers of multiple photovoltaic devices and connectors in accordance with some embodiments of this disclosure.

Turning now to FIG. 5B, a cross-sectional view along B-B, as shown in FIG. 3B, is shown depicting the layers of multiple photovoltaic devices and connectors of an integrated system 500B in accordance with some embodiments of this disclosure. Particularly, the integrated system 500B includes a first photovoltaic device 510B and a second photovoltaic device 530B that are connected in parallel to a positive connector junction 521B and a negative connector junction 522B.

Specifically, the first photovoltaic device 510B includes a bottom electrode 511B that is integrally deposited on the upper surface of the circuit board 520B. By depositing the first layer of the first photovoltaic device 510B, the bottom electrode 511B, directly onto the circuit board 520B, the upper surface of the circuit board serves as the substrate for the first photovoltaic device 510B, thereby not requiring a separate substrate. The first photovoltaic device 510B also includes a semi-conductor absorber layer 512B, a buffer layer 513B, and a top electrode 514B. The semi-conductor absorber layer 512B can specifically be a photovoltaic absorber that is deposited on the bottom electrode 511B. According to one or more additional embodiments, the semi-conductor absorber layer 512B can be either a combination of semi-conductor layers or a single semi-conductor layer with p- and n-type materials mixed in. The buffer layer 513B is deposited on the semi-conductor absorber layer 512B and the top electrode 514B is deposited on the buffer layer 513B. According to another exemplary embodiment the photovoltaic device 510B includes the four layers as shown wherein the layers are the bottom electrode 511B, a p-type semiconductor 512B, an n-type semiconductor 513B, and the top electrode 514B, where the top electrode 514B is transparent. The bottom electrode 511B is connected to a positive connector junction 521B of the circuit board 520B, which provides a connection to one or more on-board electronic components. Similarly, the top electrode 514B is connected to a negative connector junction 522B of the circuit board 520B, which provides a connection to the one or more on-board electronic components. Accordingly, through these connections the first photovoltaic device 510B can provide power to on-board electronic components on the circuit board 520B.

Similarly, the second photovoltaic device 530B includes a bottom electrode 531B that is integrally deposited on the upper surface of the circuit board 520B. By depositing the first layer of the second photovoltaic device 530B, the bottom electrode 531B, directly onto the circuit board 520B, the upper surface of the circuit board serves as the substrate for the second photovoltaic device 530B, thereby not requiring a separate substrate. The second photovoltaic device 530B also includes a semi-conductor absorber layer 532B, a buffer layer 533B, and a top electrode 534B. The semi-conductor absorber layer 532B can specifically be a photovoltaic absorber that is deposited on the bottom electrode 531B. The buffer layer 533B is deposited on the semi-conductor absorber layer 532B, and the top electrode 534B is deposited on the buffer layer 533B. The bottom electrode 531B is connected in parallel with the first photovoltaic device 510B to the positive connector junction 521B of the circuit board 520B, which provides a connection to one or more on-board electronic components. Similarly, the top electrode 534B is connected in parallel with the first photovoltaic device 510B to the negative connector junction 522B of the circuit board 520B, which provides a connection to the one or more on-board electronic components. Accordingly, through these connections the second photovoltaic device 530B can provide power to on-board electronic components on the circuit board 520B along with the first photovoltaic device 510B. According to another embodiment, the first and second photovoltaic devices can be connected in series, or when more photovoltaic devices are provided, a combination of series, parallel, and individual connections to on-board electronic components can be provided.

Figure 6:
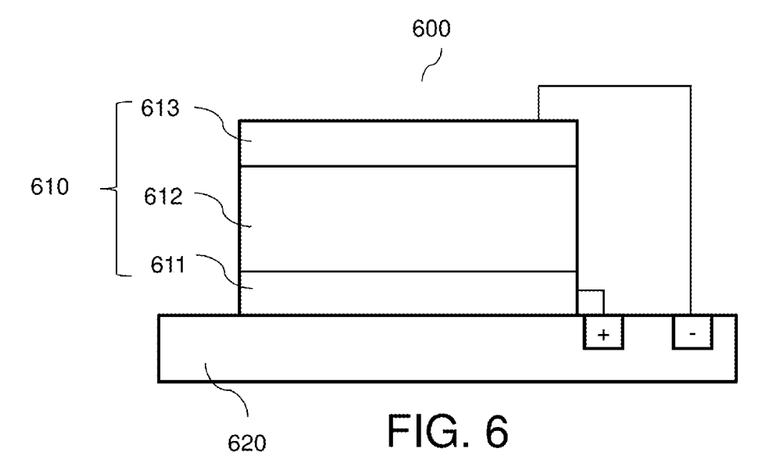
FIG. 6 is a cross-sectional view of an integrated system depicting the layers of a photovoltaic device in accordance with some embodiments of this disclosure.

In accordance with other embodiments, different photovoltaic devices can be provided with differing levels of complexity and layers. For example, turning now to FIG. 6, a cross-sectional view of an integrated system depicting the layers of a photovoltaic device 610 is shown in accordance with another embodiment of this disclosure. Particularly, as shown, the integrated device 600 includes a circuit board 620 and the photovoltaic device 610 deposited on the integrated device 600. In this embodiment the photovoltaic device 610 contains a first electrode 611, a second electrode 613, and a single semi-conductor layer 612 deposited between the first and second electrodes 611, 613. For example, this configuration where there are only three layers 611, 612, 613 is mainly applicable in an organic photovoltaic where p- and n-type materials are actually mixed into the single semi-conductor layer 612, which can also be called a single active layer 612. Other embodiments may be provided that contain additional layers provided between these layers that provide additional functionality and/or benefits. For example, a photovoltaic device may also include a protective glass layer deposited on the top electrode.

Figure 7:
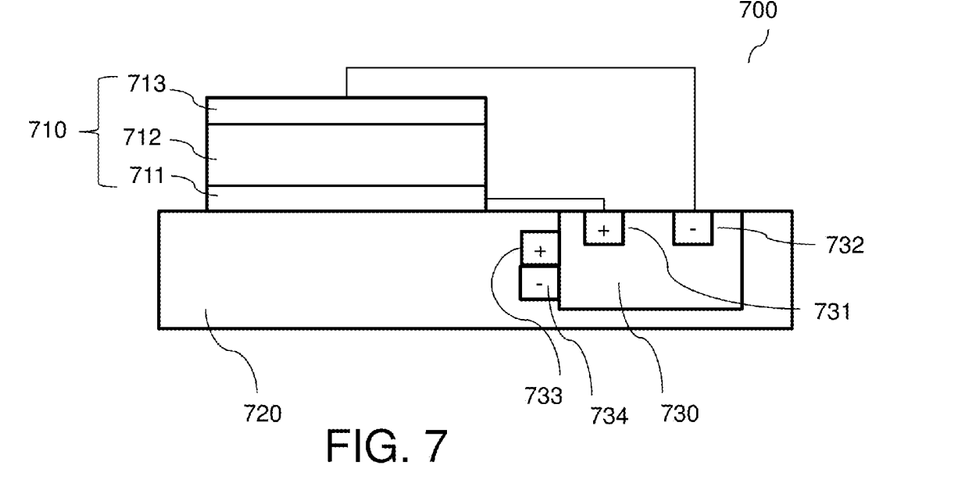
FIG. 7 is a cross-sectional view of an integrated system depicting layers in a photovoltaic device and an on-board energy storage device in accordance with some embodiments of this disclosure.

In accordance with other embodiments, an on-board energy storage device 730 can be provided. For example, turning now to FIG. 7, a cross-sectional view of an integrated system 700 depicting layers in a photovoltaic device 710 and an on-board energy storage device 730 is shown in accordance with some embodiments of this disclosure. The integrated system 700 includes a circuit board 720 on which the photovoltaic device 710 is integrally disposed and on which the on-board energy storage device 730 is provided. The photovoltaic device 710 includes a first electrode 711, a second electrode 713, and a semi-conductor absorber layer 712 placed between the electrodes 711, 713. The first and second electrodes 711, 713 are electrically connected to the on-board energy storage device 730. The on-board energy storage device 730 includes initial input positive and negative connectors 731, 732 that connect to the photovoltaic device 710 which provides generated power to the on-board energy storage device 730 for storage. The on-board energy storage device 730 also includes output positive and negative connectors 733, 734 that provide stored power to electronic components in the circuit board 720.

Figure 8A:
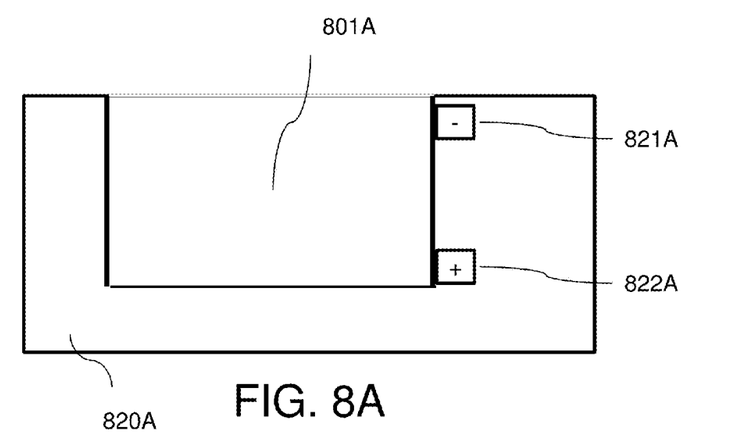
FIG. 8A depicts a circuit board with a large cavity in accordance with some embodiments of this disclosure.
Figure 8B:
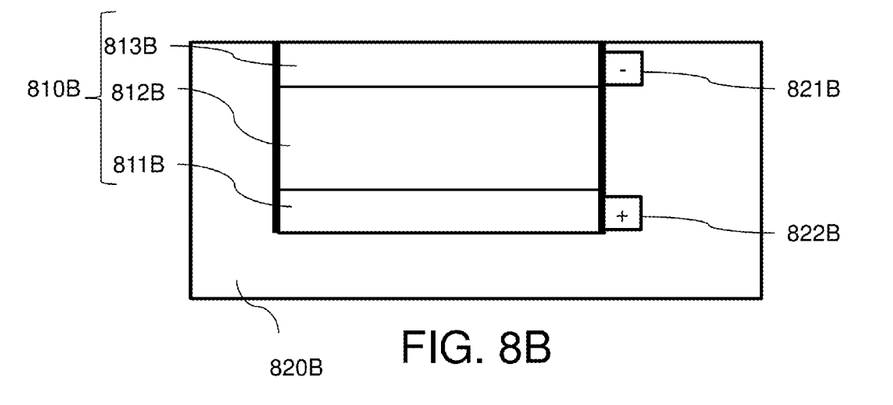
FIG. 8B depicts a circuit board with a large cavity within which a photovoltaic device is placed in accordance with some embodiments of this disclosure.

Turning now to FIG. 8A, a circuit board 820A with a large cavity 801A is shown in accordance with some embodiments of this disclosure. The circuit board 820A also includes positive and negative connector 812A, 822A that are placed so as to connect with a photovoltaic device. The cavity 801A is provided such that the floor of the cavity is planarized so that a photovoltaic device can be directly deposited using the surface as a substrate. For example, turning now to FIG. 8B, a circuit board 820B includes a large cavity within which a photovoltaic device 810B is deposited is shown in accordance with some embodiments of this disclosure. The photovoltaic device includes a first bottom electrode 811B, a semi-conductor absorber layer 812B, and a second top electrode 813B. The bottom electrode 811B connects to positive connector 822B and the top electrode connects to negative connector 821B. The deposited layers are created such that the electrodes 811B, 813B not only line up with the connectors 822B, 821B but also so that the overall photovoltaic device 810B is flush with the remaining portion of the circuit board 820B.

Figure 9:
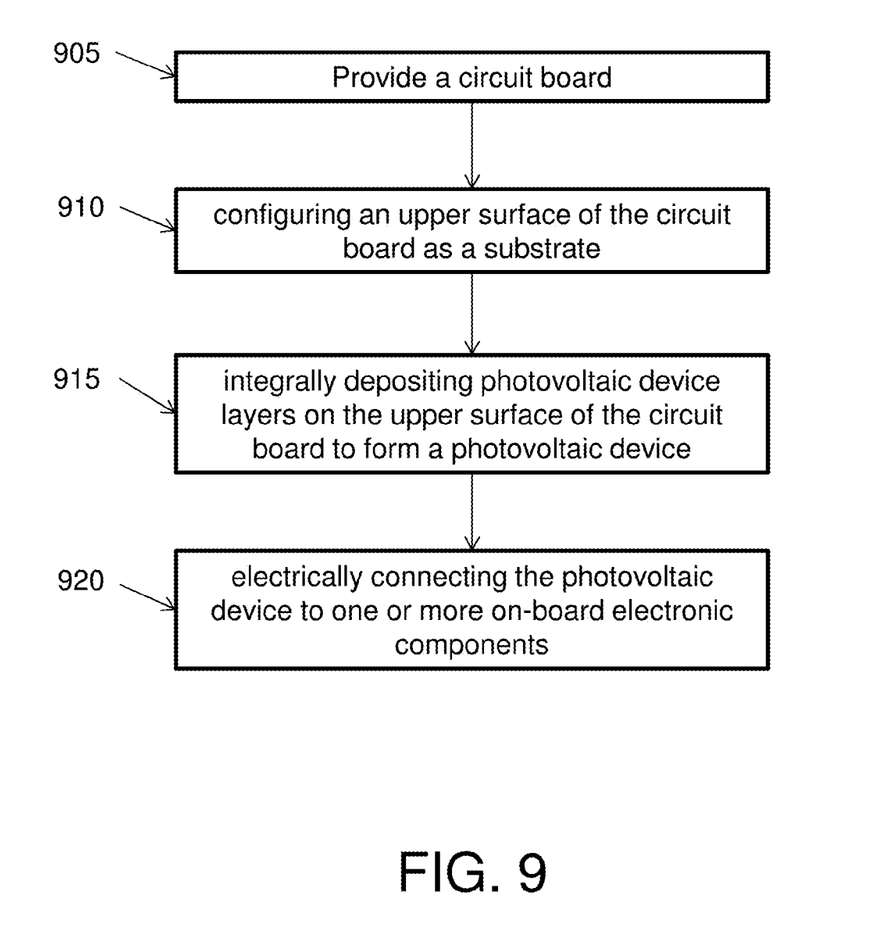
FIG. 9 depicts a process flow of a method of manufacturing an integrated device in accordance with some embodiments of this disclosure.

Turning now to FIG. 9, a process flow of a method of manufacturing an integrated device is shown in accordance with some embodiments of this disclosure. The method includes providing a circuit board (operation 905) and configuring an upper surface of the circuit board as a substrate (operation 910). Further, the method includes integrally depositing photovoltaic device layers on the upper surface of the circuit board to form a photovoltaic device using the upper surface of the circuit board as a photovoltaic device substrate (operation 915). Then the method includes electrically connecting the photovoltaic device to one or more on-board electronic components (operation 920).

Figure 10:
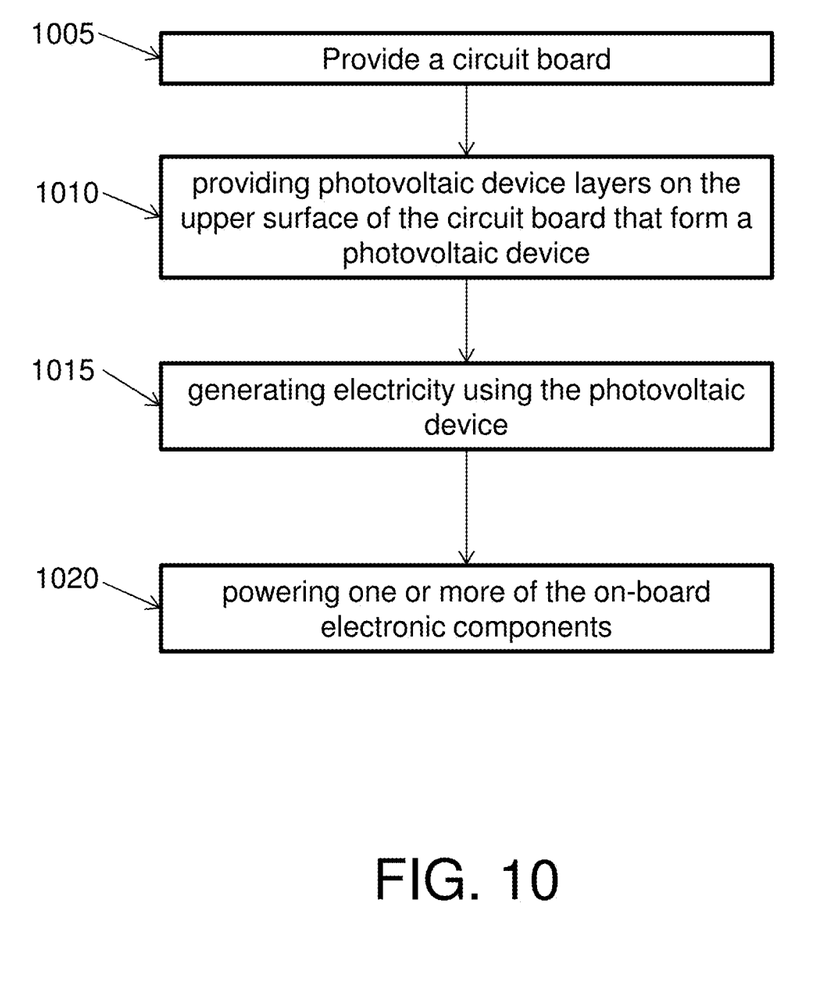
FIG. 10 depicts a process flow of a method of operating an integrated device in accordance with some embodiments of this disclosure.

Turning now to FIG. 10, a process flow of a method of operating an integrated device is shown in accordance with some embodiments of this disclosure. The method includes providing a circuit board that includes one or more on-board electronic components and an upper surface configured as a substrate (operation 1005). The method also includes providing photovoltaic device layers on the upper surface of the circuit board that form a photovoltaic device using the upper surface of the circuit board as a photovoltaic device substrate (operation 1010). The method then generates electricity using the photovoltaic device (operation 1015). Finally, the method powers one or more of the on-board electronic components using the electricity from the photovoltaic device (operation 1020).

According to another embodiment, the method may further include integrally connecting the one or more on-board electronic components to the circuit board before integrally depositing the photovoltaic device layers. Integrally depositing photovoltaic device layers is done at a maximum process temperature that is less than a component degradation temperature of the one or more on-board electronic components. Further, according to one embodiment, the component degradation temperature is 200 Celsius.

According to another embodiment, the method may further include integrally connecting the one or more on-board electronic components to the circuit board after integrally depositing the photovoltaic device layers. Integrally depositing photovoltaic device layers is done at a maximum process temperature that is thus independent of the component degradation temperature of the one or more on-board electronic components (which are not yet on-board) and less than a circuit board degradation temperature. According to one embodiment, the circuit board degradation temperature is based on a glass transition temperature of a resin in the circuit board. For example, the glass transition temperature of the circuit board may be 200-400 Celsius. According to other embodiments the component degradation temperature may be another value.

According to another embodiment, the method may further include planarizing the circuit board. Specifically, configuring the upper surface of the circuit board as the substrate may include planarizing the circuit board by removing bumps and filing holes in the upper surface. According to another embodiment, the method may further include coating the circuit board. For example, configuring the upper surface of the circuit board as the substrate may include coating the circuit board with a diffusion barrier that separates impurities in the circuit board from the photovoltaic device. According to another embodiment, the method may further include coating the top electrode with a metal contact grid and increasing stability of the device by encapsulating the device.

According to another embodiment, the method may further include modifying the surface of the circuit board (e.g. with spin-on-glass or another material) to improve the morphology of the layers to be subsequently deposited onto the board. For example, if the subsequent layers are to be processed from solutions, then the wettability of the board could impact the morphology of subsequent layers deposited on top. Surface-modification techniques performed on the planarized circuit board could thus be used to enhance the properties of the subsequent layers in the device.

Technical effects and benefits of some embodiments include reduced material cost by eliminating the need to provide a separate substrate for each photovoltaic device. Additional housing materials and wiring materials that would normally hold the separate photovoltaic device and the device that the photovoltaic device is used to power are eliminated by directly integrating the photovoltaic device onto the device circuit board. Accordingly, devices can be made with less material and fewer elements, and be structurally integrated together, providing a compact apparatus. Further, multiple photovoltaic devices can be included without expanding the device footprint.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Java, Smalltalk, C++, or the like, and conventional procedural programming languages, such as the "C" programming language or similar programming languages. The computer readable program instructions may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An integrated system that is electrically powered, the integrated system comprising:
   a circuit board comprising:
      one or more on-board electronic components; and
      an upper surface configured as a substrate; and
   a photovoltaic device integrally deposited on the upper surface of the circuit board and electrically connected to the one or more on-board electronic components, wherein the photovoltaic device comprises,
      a bottom electrode integrally deposited on the upper surface of the circuit board;
      a semi-conductor absorber layer deposited on the bottom electrode, wherein the semi-conductor absorber layer is one selected group consisting of a combination of semi-conductor layers and a single semi-conductor layer with p- and n-type materials mixed in;
      a buffer layer deposited on the semi-conductor absorber layer; and
      a top electrode deposited on the buffer layer;
   wherein the upper surface of the circuit board is a photovoltaic device substrate.

2. The integrated system of claim 1, wherein the photovoltaic device further comprises:
   a protective glass layer deposited on the top electrode.

3. The integrated system of claim 1, further comprising:
   an on-board energy storage device connected between the photovoltaic device and the one or more on-board electronic components.

4. The integrated system of claim 1, further comprising:
   a second photovoltaic device integrally deposited on the upper surface of the circuit board that is connected to the photovoltaic device in series.

5. The integrated system of claim 4, further comprising:
   an on-board energy storage device connected between the first and second photovoltaic devices and the one or more on-board electronic components.

6. The integrated system of claim 1, further comprising:
   a second photovoltaic device integrally deposited on the upper surface of the circuit board that is connected to the photovoltaic device in parallel or in series.

7. The integrated system of claim 6, further comprising:
   an on-board energy storage device connected between the first and second photovoltaic devices and the one or more on-board electronic components.

* * * * *